United States Patent
Huynh

(10) Patent No.: US 8,210,857 B2
(45) Date of Patent: Jul. 3, 2012

(54) ELECTRONIC DEVICE INCLUDING TWO ELECTRONIC COMPONENTS CONNECTED TOGETHER BY A FLEXIBLE CONNECTOR

(75) Inventor: Tan Duc Huynh, Neuilly sur Marne (FR)

(73) Assignee: Valeo Systemes Thermiques, Le Mesnil Saint Denis (FR)

( * ) Notice: Subject to any disclaimer, the term of this patent is extended or adjusted under 35 U.S.C. 154(b) by 313 days.

(21) Appl. No.: 12/597,130

(22) PCT Filed: Apr. 28, 2008

(86) PCT No.: PCT/EP2008/055158
§ 371 (c)(1),
(2), (4) Date: Mar. 5, 2010

(87) PCT Pub. No.: WO2008/135426
PCT Pub. Date: Nov. 13, 2008

(65) Prior Publication Data
US 2010/0184309 A1    Jul. 22, 2010

(30) Foreign Application Priority Data
Apr. 27, 2007  (FR) .................................... 07 03045

(51) Int. Cl.
*H01R 4/58*    (2006.01)
(52) U.S. Cl. ............. 439/91; 439/66; 349/149; 349/150
(58) Field of Classification Search ...................... 439/91, 439/66, 67; 349/149, 150
See application file for complete search history.

(56) References Cited

U.S. PATENT DOCUMENTS

| | | | | |
|---|---|---|---|---|
| 4,367,467 A | * | 1/1983 | Emile, Jr. ........................ | 349/57 |
| 4,422,728 A | * | 12/1983 | Andreaggi ...................... | 349/60 |
| 4,545,647 A | * | 10/1985 | Sasaki et al. ................... | 349/60 |
| 4,655,551 A | * | 4/1987 | Washizuka et al. ........... | 349/150 |
| 4,949,035 A |  | 8/1990 | Palmer, II. | |
| 5,358,412 A | * | 10/1994 | Maurinus et al. ............... | 439/66 |
| 5,612,804 A | * | 3/1997 | Hara ............................. | 349/149 |
| 5,636,044 A | * | 6/1997 | Yuan et al. .................... | 349/142 |
| 6,143,989 A |  | 11/2000 | Greenbaum | |

(Continued)

FOREIGN PATENT DOCUMENTS

DE    2021025 A1    11/1971

(Continued)

OTHER PUBLICATIONS

International Search Report w/translation from PCT/EP2008/055158 dated Sep. 25, 2008 (6 pages).

*Primary Examiner* — Xuong Chung Trans
(74) *Attorney, Agent, or Firm* — Osha • Liang LLP

(57) ABSTRACT

An electronic device includes least two electronic components linked electrically to one another using a flexible connector. The flexible connector includes multiple conducting blades, and is interposed between the two electrical components such that longitudinal edges of the flexible connector are held in contact against respective connection pads of each of the electronic components. The flexible connector is ultimately compressed, respectively, against both electronic components. The electronic device is equipped with two additional conducting blades for checking the state of compression of the flexible connector. The two additional conducting blades include an electrical circuit for determining the state of compression of the flexible connector by a resistive measurement and integrating at least one additional conducting blade of the flexible connector.

17 Claims, 4 Drawing Sheets

U.S. PATENT DOCUMENTS

| | | | |
|---|---|---|---|
| 6,296,493 B1 * | 10/2001 | Michiya | 439/66 |
| 6,448,508 B1 | 9/2002 | Lequenne | |
| 6,685,487 B2 * | 2/2004 | Ward et al. | 439/91 |
| 2003/0114033 A1 | 6/2003 | Matumoto et al. | |
| 2006/0134997 A1 | 6/2006 | Curtis et al. | |

FOREIGN PATENT DOCUMENTS

| | | |
|---|---|---|
| DE | 202 10 025 U1 | 8/2003 |
| EP | 1 052 736 A1 | 11/2000 |
| EP | 1 322 001 A1 | 6/2003 |
| WO | 94/07318 A1 | 3/1994 |

* cited by examiner

ELECTRONIC DEVICE INCLUDING TWO ELECTRONIC COMPONENTS CONNECTED TOGETHER BY A FLEXIBLE CONNECTOR

TECHNICAL FIELD OF THE INVENTION

The invention is in the field of liquid crystal display devices, in particular intended to be installed on a structural element of a motor vehicle. Its subject is such a device comprising two electronic components linked together by a flexible connector.

PRIOR ART

In the automobile field, it is commonplace to equip a vehicle with an electronic device comprising two electronic components linked together by a flexible connector. Such a device is for example an information display device which is intended to be installed on a structural element of the vehicle, such as an instrument panel, a console or the like. This device is for example designed to deliver to a user of the vehicle an item of information, such as a general item of information, e.g. the date, time, temperature outside the vehicle or the like. This device is also able to deliver to the user a particular item of information relating to the working of the vehicle, or indeed an item of information relating to the working of an installation fitted to the vehicle, such as a ventilation, heating and/or air-conditioning installation.

In the example case where the electronic device is a display device, a first electronic component is organized as a display screen, of liquid crystal type in particular or the like, while a second component is a control card for driving the operation of the display screen. The control card and the display screen are housed in a package while being arranged overlaid one above the other. A luminous source, such as a light-emitting diode or the like, is placed between the display screen and the control card so as to illuminate the display screen by backlighting.

The display screen comprises a plurality of electrical tracks which comprise display segments integrated into the screen. Each segment is made of liquid crystals, employing a photolithography method for example, and is bordered by two electrodes. An electric voltage may be applied to the electrodes of a segment so as to orient the latter's liquid crystals so that the light emitted by the luminous source passes through it. The application of the electric voltage to a particular segment is controlled by a microprocessor that the control card comprises.

The general problem of the connection of the electrical tracks of the display screen with the microprocessor therefore arises. The electric current flowing through the electrical tracks of the display screen being of low strength, less than a milliampere in particular, the electrical tracks of the display screen and the microprocessor can be linked electrically by way of a flexible connector. The latter consists of a plurality of conducting blades, made of carbon in particular, an insulating blade, made of an electrically insulating polymer, such as a silicone or the like, being interposed between two successive conducting blades. An end of a conducting blade is in contact with a first connection pad carried by the control card, while the other end of the conducting blade is in contact with a second constituent connection pad of the electrical track of the display screen.

To allow reliable operation of the display device, it is necessary that, in the course of the process of assembling the latter, electrical contact between on the one hand the connection pads of the display screen and those of the control card and on the other hand the corresponding ends of the conducting blades be accurate, reliable, fast to perform and nevertheless enduring. The flexible nature of the connector constitutes a drawback opposing the reliability of the device, the flexible connector tending to deform while being put in place between the display screen and the electronic control card. This deformation may give rise to a break in electrical contact between the connection pads and the ends of the blades. On completion of the process of assembling the display device, the flexible connector is difficult to access, so that repositioning of the latter is lengthy and irksome, for an end result that is still random and uncertain. It ultimately follows from this that flexible conductors such as these are tending to be replaced with rigid connectors, which exhibit the drawback of being more cumbersome and more expensive, and which require greater dimensional checking relative to flexible connectors.

SUBJECT OF THE INVENTION

The aim of the present invention is to propose an electronic device comprising at least two electronic components linked electrically to one another by a flexible connector, the reliability of whose layout is readily and rapidly checked, so as to guarantee satisfactory operation of the electronic device.

The electronic device of the present invention is a device intended to be installed on a structural element of a motor vehicle. This electronic device comprises at least two electronic components linked electrically to one another by way of a flexible connector. The latter comprises a plurality of conducting blades whose ends are held in contact against respective connection pads that each of the electronic components comprises.

According to the present invention, the electronic device is equipped with a means for checking the state of compression of the flexible connector.

These arrangements are such that, at the conclusion of the process of assembling the electronic device, the state of compression of the flexible connector can be readily and rapidly verified.

The checking means advantageously comprises an electrical circuit dedicated to determining the state of compression of the flexible connector.

The checking means advantageously comprises an electrical circuit integrating at least one additional conducting blade of the flexible connector.

It results from these arrangements that it is possible to check selectively, and more particularly in the vicinity of the constituent additional conducting blade of the electrical circuit, the state of compression of the flexible connector.

According to another characteristic of the invention, the ends of the conducting blades are held in contact against respective connection pads that each of the electronic components comprises.

The electrical circuit preferably integrates two additional conducting blades of the flexible connector which are respectively arranged at the opposite lateral edges of the latter.

These arrangements are such that the state of compression of the flexible connector is checked over the whole of its length.

The electrical circuit comprises a reference resistor $R_f$ mounted in series with at least one additional conducting blade.

The checking means furthermore advantageously comprises means for calculating the total resistance $R_t$ of the electrical circuit.

The checking means preferably comprises means for converting the measured total resistance Rt of the electrical circuit into a coefficient of compression of the flexible connector.

The state of compression of the flexible connector is appraised on the basis of a calculation of the total resistance of the electrical circuit, the latter comprising the contact zones between the connection pads and the ends of the blades. As there exists an inversely proportional relation between the state of compression of the flexible connector and the resistance of said contact zones, it is possible to deduce an estimation of the coefficient of compression of the flexible connector from a calculation of the total resistance Rt of the electrical circuit.

The checking means advantageously comprises means for comparing the compression coefficient calculated with respect to a preset value.

The preset value is preferably 10%.

It is apparent from use that a compression of 10% of the flexible connector constitutes a threshold value and that a compression of the connector lower than this threshold value does not guarantee satisfactory continuity of the electrical circuit at the level of the contact zones. It will be understood that a compression of 10% of the flexible connector corresponds to a decrease of 10% of a dimension of the connector relating to its extension between the electronic components.

According to a preferred variant embodiment of the present invention, a first electronic component is a display screen while a second electronic component is a control card for driving the operation of the display screen.

The display screen is for example a liquid crystal screen.

The display screen is in particular a screen for displaying an item of information relating to the working of a ventilation, heating and/or air-conditioning installation.

Advantageously, a part of the electrical circuit is carried by the display screen.

Preferably, the checking means is housed inside the electronic device.

These arrangements are such that the checking means are intrinsically integrated with the electronic device, without the need to resort to any accessory apparatus.

The invention also pertains to a control board comprising an electronic device according to one of the preceding characteristics.

Furthermore, the invention pertains to an apparatus able to cooperate with the checking means of the electronic device so as to determine the state of compression of the flexible connector, comprising means for calculating the total resistance Rt of the electrical circuit, means for converting the measured total resistance Rt of the electrical circuit into a coefficient of compression of the flexible connector and means for comparing the compression coefficient calculated with respect to a preset value.

Advantageously, the preset value is 10%.

DESCRIPTION OF THE FIGURES

The present invention will be better understood, and apposite details will be apparent, on reading the description which will be given of variant embodiments in connection with the figures of the appended plates, in which:

In FIG. 1, an electronic device is represented. According to this embodiment, the electronic device formed by a device for displaying an item of information relating to a ventilation, heating and/or air-conditioning installation of a motor vehicle comprises a display screen 1 and an electronic control card 2 for driving the operation of the display screen 1. The display device is for example intended to be installed on a structural element of the vehicle, such as an instrument panel, a control board or the like, so as to deliver to a user the item of information relating to the working of the installation.

Figure 1:
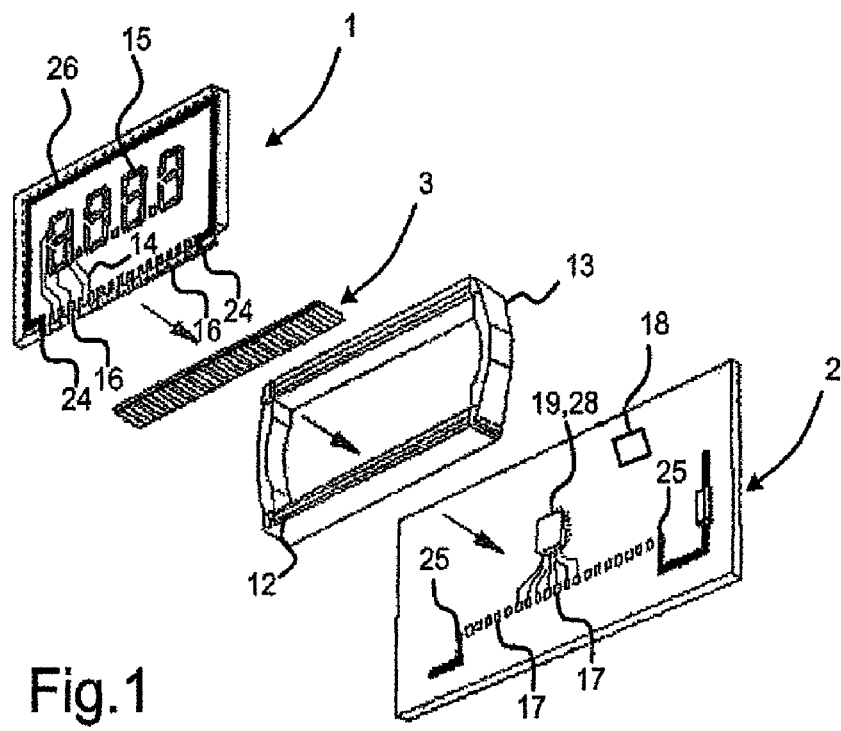
FIG. 1 is a schematic view in exploded perspective of a display device according to the present invention.
Figure 2:
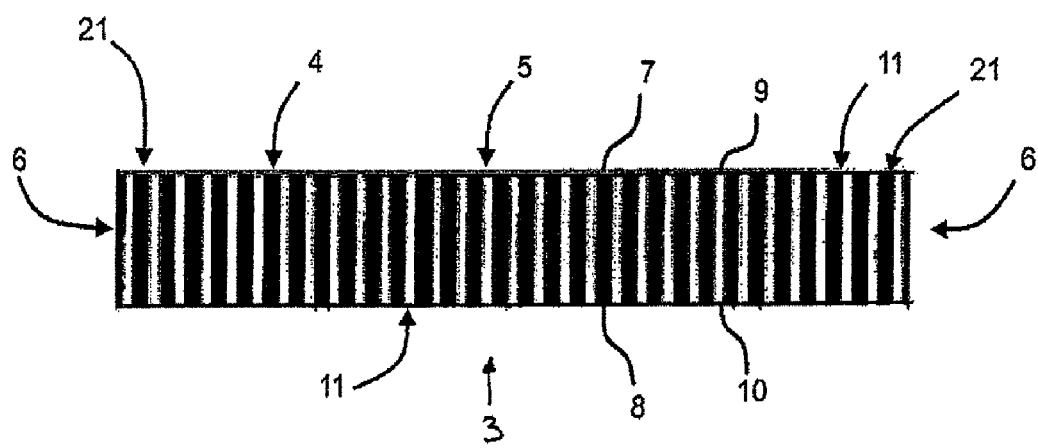
FIG. 2 is a schematic view of a constituent flexible connector of the display device illustrated in the previous figure.

The display screen 1 and the control card 2 are linked electrically to one another by a flexible connector 3, such as that illustrated in FIG. 2. Such a connector is known as a laminated elastomer connector (called a "zebra connector") comprising a succession of non-conducting elastomer layers and of conducting elastomer layers arranged alternately, the layers having edges which define two opposite connection surfaces on the connector. The term "flexible" is intended to mean the fact that the connector can be compressed without suffering impairment. This flexible connector 3 is of the elastomer connector type. It is formed of an alternating succession of electrically conducting blades 4, for example made of carbon, and of electrically insulating blades 5, in particular made of a plastic, such as a silicone. The conducting blades 4 and insulating blades 5 are oriented parallel to the lateral edges 6 of the flexible connector 3 so that the ends 7, 8 of a conducting blade 4 and the ends 9, 10 of an insulating blade 5 are arranged alternately at the longitudinal edges 11 of the flexible connector 3.

When assembling the constituent elements of the display device, the flexible connector 3 is inserted into a groove 12 made in a package 13 of annular shape. Then, the latter 13 is interposed between the display screen 1 and the control card 2, in such a way that the longitudinal edges 11 of the flexible connector 3 are held in contact, and ultimately compressed, respectively against the display screen 1 and the control card 2.

Figure 3:
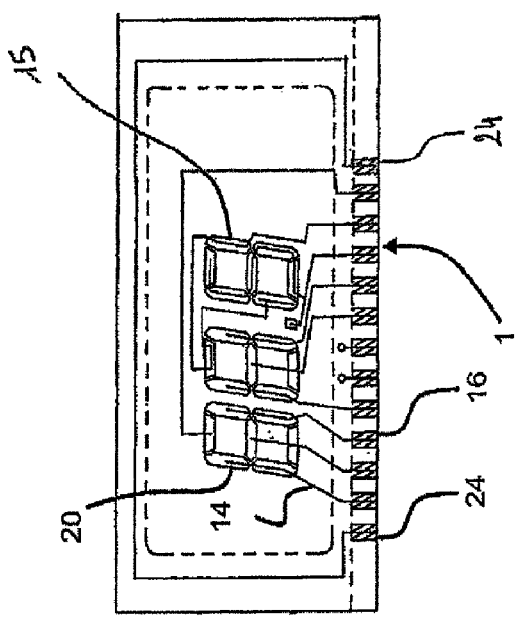
FIG. 3 and FIG. 4 are respective schematic views of variant embodiments of a constituent display screen of the display device illustrated in FIG. 1.
Figure 4:
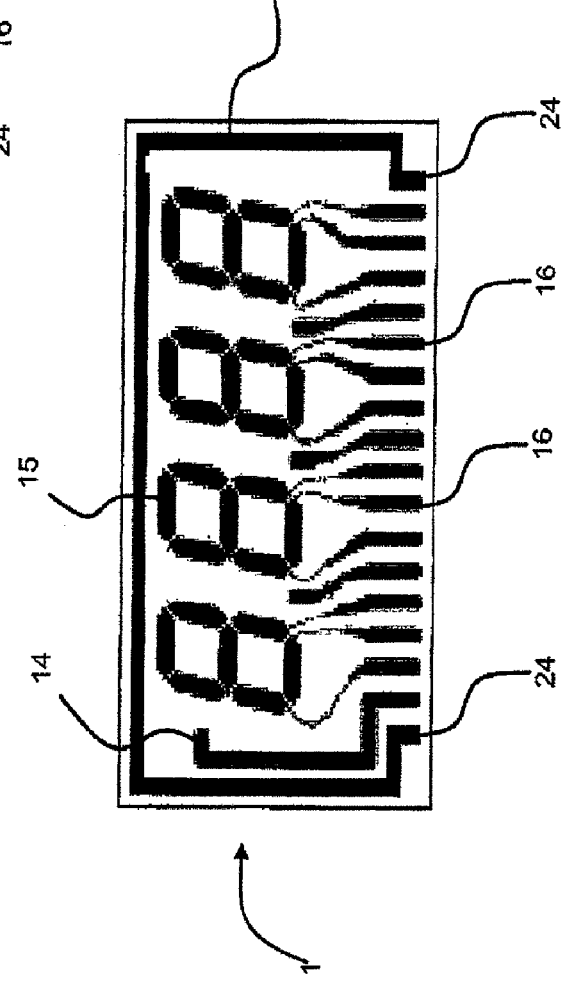

The display screen 1, of the type of those illustrated in FIG. 3 and FIG. 4, integrates a plurality of electrical tracks 14 comprising at least one display segment 15 made of liquid crystals. Each electrical track 14 comprises a connection pad 16 made at the peripheral border of the display screen 1. Each connection pad 16 of the display screen 1 is in contact with a first end 7 of a conducting blade 4 of the flexible connector 3, the second end 8 of each conducting blade 4 being in contact with a connection pad 17 made on the control card 2. The latter 2 is equipped with a luminous source 18, in particular a light-emitting diode, and with a microprocessor 19 linked with the set of connection pads 17 of the control card 2. The microprocessor 19 is able to deliver a voltage to electrodes 20 bordering each display segment 15 so as to orient the liquid crystals of the latter 15, in such a way that they let through the light emitted by the luminous source 18. This voltage is transmitted from the microprocessor 19 to a particular display segment 15 by way of the corresponding connection pad 17 of the control card 2, and then of the conducting blade 4 assigned to this connection pad 17, and then by way of the corresponding connection pad 16 of the display screen 1 which is linked with the electrical track 14 comprising said particular segment 15.

Figure 5:
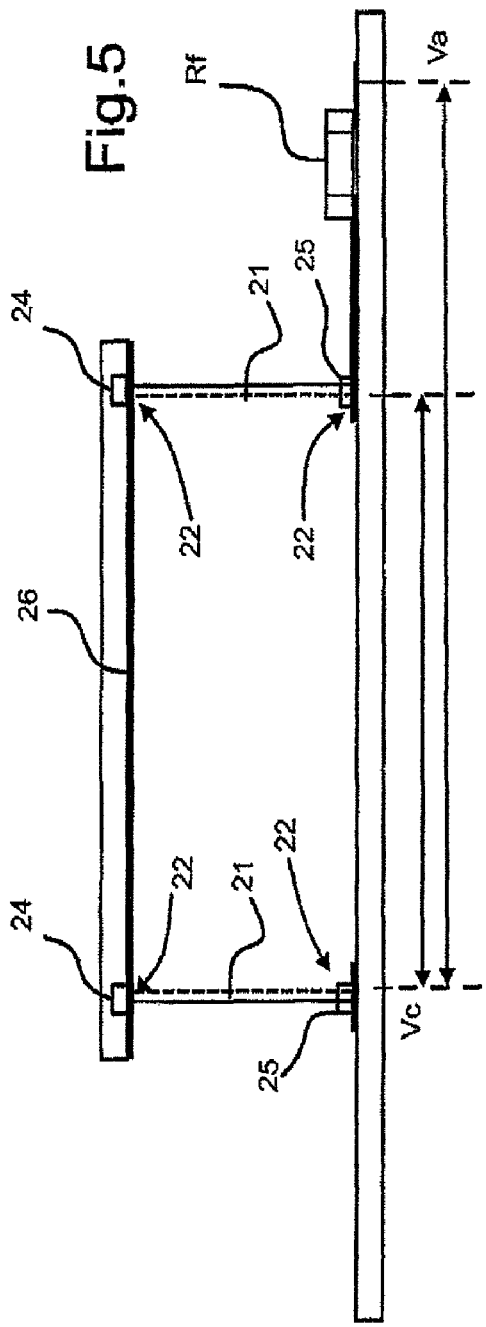
FIG. 5 is a schematic sectional view of the display device illustrated in FIG. 1.

In FIG. 5, the flexible connector 3 comprises, in addition to the conducting blades 4, two additional conducting blades 21 which are made at its opposite lateral edges 6. These additional conducting blades 21 are identical to the conducting blades 4 from the point of view of their structure. They constitute together with the conducting blades 4 a monoblock assembly forming the flexible connector 3. It is thus advantageously proposed by the present invention that two additional conducting blades 21, which constitute in part a means 32 for checking the state of compression of the flexible connector 3, be appended to the conducting blades 4 which are intended to operate the display segments 15. More particularly, this appending of two additional conducting blades 21 makes it possible to appraise the quality of the electrical continuity in contact zones 22 between the ends 7, 8 of the conducting blades 4 and the corresponding connection pads 16, 17. These contact zones 22 exhibit electrical resistances which are all the more considerable when the ends 7, 8 of the conducting blades 4 and the connection pads 16, 17 are compressed one against another in an unsatisfactory manner. It is therefore advantageously proposed by the present invention that a measurement of the total electrical resistance Rt of the electrical circuit be utilized, since the value of the electrical resistance Rt is dependent on the electrical resistances of the contact zones 22, so as to deduce therefrom a compression ratio C for the flexible connector 3 and ultimately an estimation of the quality of the electrical continuity of these contact zones 22.

Figure 6:
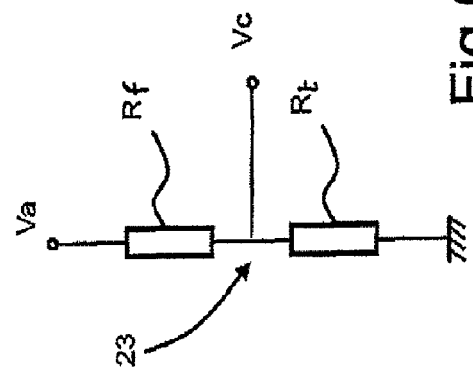
FIG. 6 is a schematic illustration of a constituent electrical layout of an electronic component of the display device illustrated in FIG. 1 and FIG. 5.
Figure 7:
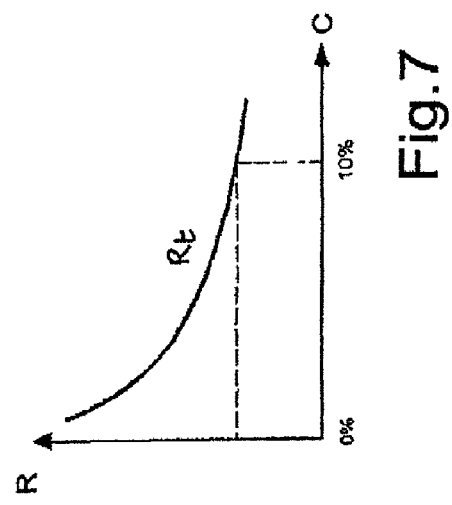
FIG. 7 represents a curve illustrating the resistance of the flexible connector illustrated in FIG. 2 as a function of its compression state.

For this purpose, the checking means 32 comprises an electrical circuit 23 dedicated to determining the state of compression of the flexible connector 3. Thus, the additional conducting blades 21 form an integral part of an electrical circuit 23, illustrated in FIG. 6. By applying a check voltage Va across the terminals of this electrical circuit 23, it is possible to measure the total electrical resistance Rt of the electrical circuit 23. Because the value of the total electrical resistance Rt depends on the value of the resistance of each contact zone 22 and because the resistance of the contact zones 22 of a flexible connector 3 varies in a manner inversely proportional to the compression ratio C of this flexible connector 3, such as illustrated in FIG. 7, it is possible to deduce the state of compression of the flexible connector 3. If this compression state is below a threshold value of 10%, it is considered that contact between the flexible connector 3, the display screen 1 and the control card 2 is unsatisfactory, or indeed defective.

The electrical circuit 23 also comprises additional connection pads 24, 25 respectively made on the display screen 1 and the control card 2, which are in contact with the corresponding ends 7, 8 of the additional conducting blades 21. The electrical circuit 23 further comprises an extra track 26 made at the peripheral border of the display screen 1, which links together the additional connection pads 24 of the display screen 1. Thus, a part of the electrical circuit 23 is carried by the display screen. The electrical circuit 23 finally comprises a reference resistor Rf of known value which is carried by the control component 2 while being placed in series with the additional conducting blades 21 and the extra track 26. This reference resistor Rf forms a voltage divider bridge for which the following relation holds:

$$Vc/Rt = Va/(Rf+Rt)$$

in which:

Vc is a voltage measured at the terminals of the flexible connector 3, and

Va is a known voltage applied to the terminals of the electrical circuit 23.

Figure 8:
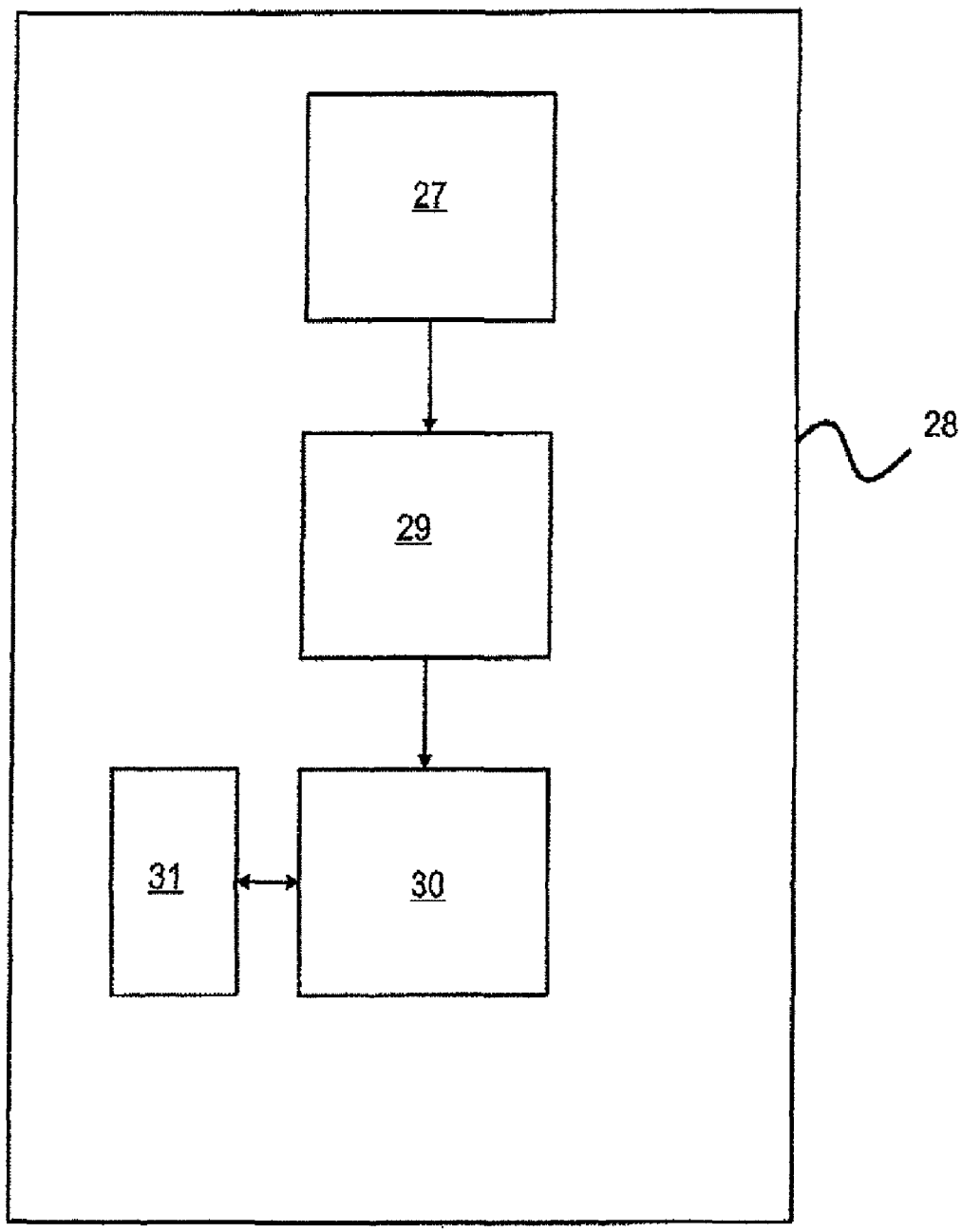
FIG. 8 is a schematic illustration of a constituent microcontroller of the display device illustrated in FIG. 1.

The measurement of the voltage Vc makes it possible to deduce a value of Rt on the basis of the operation of calculation means 27 of a microcontroller 28, such as illustrated in FIG. 8. The latter 28 is either an external microcontroller fitted to the display device or an internal microcontroller integrated into the microprocessor 19 carried by the control card 2. In the case where the microcontroller 28 is termed "external", the latter is housed in an apparatus able to cooperate with the checking means 32 of the electronic device. This apparatus, once connected to the electrical circuit 23, makes it possible to determine the state of compression of the flexible connector 3. Thus, this apparatus makes it possible, for example, to check the state of compression of the flexible connector 3 when the latter is mounted between the display screen and the control card at the end of the production line without needing to access the flexible connector 3 directly. It suffices to link the apparatus electrically to the electrical circuit at the level of the control card in order to determine the state of compression of the flexible connector. This apparatus is furnished with connection means allowing electrical hookup between the microcontroller that it comprises and the electrical circuit 23. In the case where the microcontroller is termed "internal", it is housed inside the electronic device. The microcontroller 28 also comprises means 29 for converting the value of Rt into a coefficient of compression of the flexible connector 3. The compression coefficient corresponds to a variation of dimension of the distance between the ends 7, 8 of the conducting blades 4 of the flexible connector 3 when the latter 3 is interposed under contact between the display screen 1 and the control card 2. The microcontroller 28 finally comprises means 30 for comparing the compression coefficient calculated with respect to a preset value contained in memory means 31 associated with the comparison means 30. It is estimated that if this variation is below 10%, the connection of the flexible connector 3 with the display screen 1 and the control card 2 may be defective.

According to an alternative (not represented), there is provision to make the flexible connector 3 with a single additional conducting blade 21 and to link the extra track 26 to one of the outputs of the display screen which is for example of the "LCD" liquid crystal type. When checking the compression state, the circuit for driving the display screen 1 is placed at high impedance. The track 26 is thereafter biased as a divider bridge as explained above so as to check the state of compression of the flexible connector 3.

The invention claimed is:

1. An electronic device comprising:
at least two electronic components linked electrically to one another by way of a flexible connector comprising a plurality of conducting blades, wherein the flexible connector is interposed between the two electrical components such that longitudinal edges of the flexible connector are held in contact against respective connection pads that each of the electronic components comprises, and wherein the flexible connector is compressed, respectively, against the at least two electronic components, and first and second conducting blades comprising an electrical circuit, which together are configured to check the state of compression of the flexible connector, wherein the electrical circuit is configured to determine the state of compression of the flexible connector by a resistive measurement, and integrate at least one additional conducting blade of the flexible connector.

2. The electronic device as claimed in claim 1, wherein the plurality of conducting blades comprises an alternating succession of electrically conducting blades and electrically insulating blades, oriented parallel to the lateral edges of the flexible connector so that ends of a conducting blade and ends of an insulating blade are arranged alternately at the longitudinal edges of the flexible connector.

3. The electronic device as claimed in claim 2, wherein the electrically conducting blades are made of carbon.

4. The electronic device as claimed in claim 2, wherein the electrically insulating blades are made of silicone.

5. The electronic device as claimed in claim 1, wherein the first and second conducting blades are respectively arranged at the opposite lateral edges of the flexible connector.

6. The electronic device as claimed in claim 1, wherein the electrical circuit comprises a reference resistor Rf mounted in series with the first and second conducting blades.

7. The electronic device as claimed in claim 1, wherein the electrical circuit comprises a processor for calculating-the total resistance Rt of the electrical circuit (23).

8. The electronic device as claimed in claim 7, wherein the processor is configured to convert the measured total resistance Rt of the electrical circuit into a coefficient of compression of the flexible connector.

9. The electronic device as claimed in claim 8, wherein the processor is further configured to compare the compression coefficient calculated with respect to a preset value.

10. The electronic device as claimed in claim 9, in which the preset value is 10%.

11. The electronic device as claimed in claim 1, in which a first of the at least two electronic components is a display screen while a second of the at least two electronic components is a control card for driving the operation of the display screen.

12. The electronic device as claimed in claim 11, in which the display screen is a liquid crystal display screen.

13. The electronic device as claimed in claim 12, in which a part of the electrical circuit is carried by the display screen.

14. The electronic device as claimed in claim 1, wherein the first and second conducting blades are housed inside the electronic device.

15. A control board comprising an electronic device as claimed in claim 1.

16. An apparatus able to cooperate with the first and second conducting blades of the electronic device as claimed in claim 1 to determine the state of compression of the flexible connector, comprising:
    a processor configured to:
        calculate the total resistance Rt of the electrical circuit,
        convert the measured total resistance Rt of the electrical circuit into a coefficient of compression of the flexible connector, and
        compare the compression coefficient calculated with a preset value.

17. The apparatus as claimed in claim 16, in which the preset value is 10%.

* * * * *